United States Patent

[11] 3,571,663

[72] Inventor Lloyd A. Hungate
Charlottesville, Va.

[21] Appl. No. 789,760
[22] Filed Jan. 8, 1969
[45] Patented Mar. 23, 1971
[73] Assignee Chemetron Corporation
Chicago, Ill.

[54] RELEASABLE CLAMP ASSEMBLY FOR A SOLID STATE CIRCUIT ELEMENT
10 Claims, 4 Drawing Figs.

[52] U.S. Cl. .......... 317/100, 174/HS, 317/234
[51] Int. Cl. .......... H01l 1/12
[50] Field of Search .......... 317/100, 234.1, 6; 174/HS, 15, 16

[56] References Cited

UNITED STATES PATENTS

| | | | |
|---|---|---|---|
| 3,369,597 | 2/1968 | Dronsuth | 317/100X |
| 3,188,252 | 6/1965 | Trigger | 317/234 |
| 3,226,466 | 12/1965 | Martin | 317/234 |
| 3,238,425 | 3/1966 | Geyer | 317/234 |
| 3,396,311 | 8/1968 | Maltner | 310/8.7X |

FOREIGN PATENTS

| | | | |
|---|---|---|---|
| 1,000,023 | 8/1965 | Great Britain | 317/234 |

*Primary Examiner*—Lewis H. Myers
*Assistant Examiner*—Gerald P. Tolin
*Attorney*—James E. Nilles

ABSTRACT: The present disclosure includes a releasable clamp holding a disclike solid state rectifier between a pair of heat sink plates. A pair of mounting bolts extends through openings in the heat sink plates to the diametrically opposite side of the rectifier. A saddle member is pivotally connected at one end to one of the support bolts and at the other end to the opposite support bolt by serrated mating surfaces. A pressure cup is pivotally interconnected to the central portion of the saddle member and telescoped over a guide toward a pressure plate which is aligned with and adapted to bear on the outer heat sink in alignment with the rectifier. A Belleville spring and a pressure control washer are interposed between the cup and the pressure plate. A lever cam is pivotally mounted to the saddle member and has a first position and a second position to compress and release the spring respectively to clamp and unclamp the rectifier.

Inventor
Lloyd A. Hungate
By James E. Nilles
Attorneys

RELEASABLE CLAMP ASSEMBLY FOR A SOLID STATE CIRCUIT ELEMENT

This invention relates to a releasable clamp mounting assembly for solid-state circuit elements such as silicon controlled rectifiers, diodes and the like.

Solid-state current control devices have in recent years been developed and have substantial advantages over the prior arc vacuum tube devices. Many of the solid-state elements, however, are temperature sensitive. Thus, solid-state rectifying devices such as diodes and silicon controlled rectifiers have severe temperature limitations. If the junction temperature of the solid-state rectifier increases above a given limit, permanent changes in the characteristics and/or complete failure of the device may result. Even if the destruction temperature is not reached, the variation in the characteristic with temperature may be such as to result in circuit malfunctioning with a consequent disruption of one or more components. As a result, special cooling means either integrally formed with the diode or separately attached to the solid-state element are employed. In relative small components, the case and internal construction is such that the radiation and conduction cooling associated with the surface as well as conduction along the connecting leads permit normal operation. High current capacity devices, however, are provided with an integral cooling fin and/or are mounted to a separate heat sink.

In the heat sink mount, the solid-state element is provided with a threaded stud which threads into the heat sink or passes through an opening with a clamping nut attached to establish firm mechanical and thermal contact to the heat sink. The element is normally attached with a suitable spring means or other elastic means to compensate for any deformation or changes in the relative rates of expansion and contraction of the components and thereby maintain a firm, positive contact between the element and the heat sink. Often the heat sink may also be made part of the circuit connection, for example, a common ground return or the like. The heat sink may consist of a suitable metal bar which is adapted to rapidly conduct the heat away and which may or may not be provided with additional liquid or forced air cooling. Generally, copper has been the most satisfactory material for the heat sink and for the connecting stud because of its exceptionally high thermal conductivity. Steel or aluminum may be employed where cost, weight and east of formation considerations and the like are predominant. Although the stud mounted contact has been widely employed, the effectiveness and replacement has presented disadvantages from the standpoint of cost and maintenance.

The present invention is particularly directed to releasably clamping the solid-state element to a heat sink member with means to maintain firm equalized pressure engagement between the solid-state element and the cooling surface and thereby establish and maintain optimum cooling for heat transfer from the element to the heat sink. Generally, in accordance with the present invention, the heat sink includes a planar cooling surface upon which the corresponding planar base of the solid-state element rests. A releasable lever means in secured to a fixed support means. A spring means overlies the outer end of the solid-state element and is coupled to the releasable lever means which has a first position in which it forces and holds the spring means in clamping engagement with the solid-state element and a second position releasing the spring means from the solid-state element to permit removal and insertion thereof. In a particularly novel and highly satisfactory structure for clamping of a solid-state disc element between a pair of cooling platelike fins, the fixed support means is secured in insulated relationship to the heat sink and extends outwardly therefrom to the opposite side of the cooling surface and in particular the location of the solid-state element. The releasable lever means includes a saddle member connected to one of the support rods and having the other end interconnected to the opposite support rod by a ratchet type releasable tooth engagement. The spring means includes a pressure cup pivotally interconnected to the central portion of the saddle member and telescoped over a guide toward a pressure plate which is aligned with and adapted to bear on the outer end of the solid-state disc. An annular spring, and, if required, pressure control washers, are interposed between the cup and the pressure plate. A lever cam is pivotally mounted to the saddle member and has a first position which urges the saddle member toward the outer cooling fin or plate and thereby forces the pressure cup and the springs onto the pressure plate in alignment with the solid-state element to transmit the clamping pressure to the upper or outer end of the solid-state disc element. In the alternate position of the lever cam, the saddle moves outwardly of the pressure plate and disc to release the springs and thereby release the clamping of the solid-state disc element.

Applicant has found that the mounting in accordance with the present invention provides reliable thermal cooling of solid-state diodes, controlled rectifiers and the like while permitting relatively simple and inexpensive mounting and replacement of the element if and when required.

The drawing furnished herewith illustrates the best mode presently contemplated by the inventor for carrying out the invention and clearly discloses the above advantages and features as well as others which will be readily understood from the following description of such drawing and the structure shown therein:

Figure 1:
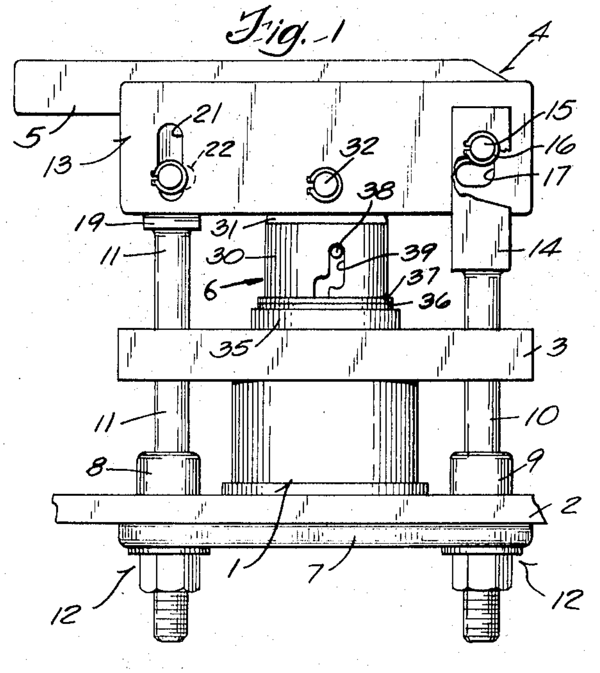
FIG. 1 is a side elevational view of disc type diode mounted to a heat sink in accordance with the teaching of the present invention.
Figure 2:
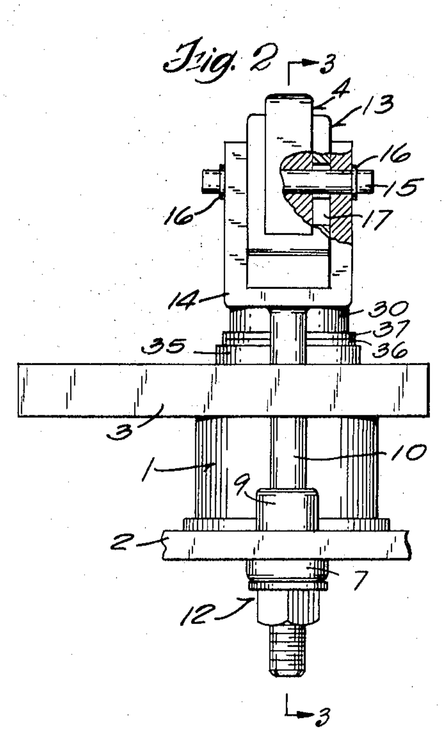
FIG. 2 is a side elevational view of FIG. 1.

Referring to the drawing and particularly to FIG. 1, a solid-state element 1 which may be a pellet or disc type solid-state element, having opposite planar clamping ends, is shown mounted between a pair of cooling fins or plates 2 and 3 for purposes of clearly disclosing the subject matter of the present invention.

The element 1 may be a silicon controlled rectifier, a diode, or other similar solid-state element which normally includes a base portion and an outer protective cap with the solid conducting pellet and connecting elements mounted within the housing and interconnected either through separate terminal leads or through suitable inner connection to the opposite ends of the outer shell, in accordance with well-known theory and constructions. Consequently, element 1 is shown in block diagram in the drawing and described as a diode element clamped between the cooling plates 2 and 3 and connected in circuit therethrough The plate 2 may define a mounting plate to which one or more additional similar elements or other circuit components are connected and furthermore may define one of the electrical terminals for connection to the diode element 1. The cooling plate 2 is shown as a single member associated with the solid-state diode 1 and may constitute the other circuit terminal for the diode 1. Although a pair of cooling plates 2 and 3 are shown, the invention may obviously be employed with a single base element 2 with the mounting clamping as presently described applied directly to the outer end of the element 1.

Generally, in accordance with the present invention a releasable lever type clamp assembly 4 is interconnected to the plate 2 and includes a pivotal cam lever 5 for selectively positioning a spring loading means or unit 6 in clamping engagement with the outer surface of the plate 3 in physical alignment with the element 1 and alternatively spacing or releasing the spring unit 6 from the plate and thereby permitting the convenient removal and insertion of the element 1 directly between the clamping members which in the illustrated embodiment of the invention include the cooling plates 2 and 3.

More particularly, the releasable clamp assembly 4 is interconnected to the plate 2 to define a fixed support means including an insulating clamp base 7 which extends across the back side of the plate 2 and includes a pair of integral hubs 8 and 9 projecting through corresponding openings in the plate 2, on the opposite sides of the element 1. A pair of clamping rods or bolts 10 and 11 similarly extend through the respective hubs 8 and 9. Stop nut and washer units 12 are interconnected to the back ends of the clamping bolts 10 and 11 to prevent the movement of the bolts completely through the openings. A saddle member 13 is selectively interconnected to the outer ends of the bolts 10 and 11 and positioned axially of the element 1 by the positioning of the pivotal lever 5. The spring loading unit 6 is interconnected to the saddle member 13 between the bolts 10 and 11 and selectively moved into clamping engagement with the plate 3 and thereby the element 1.

The upper or outer end of bolt 10 is bifurcated to define an outwardly opening U-shaped fork 14 within which the adjustable saddle member 13 is pivotally mounted by a retaining pin or bolt 16 which passes laterally through appropriate openings in the sidewall of the fork 14 and the saddle member 13.

In the illustrated embodiment of the invention, the pin 15 as well as the other pins which are hereinafter described are held in position by end retainer rings 16.

Figure 3:
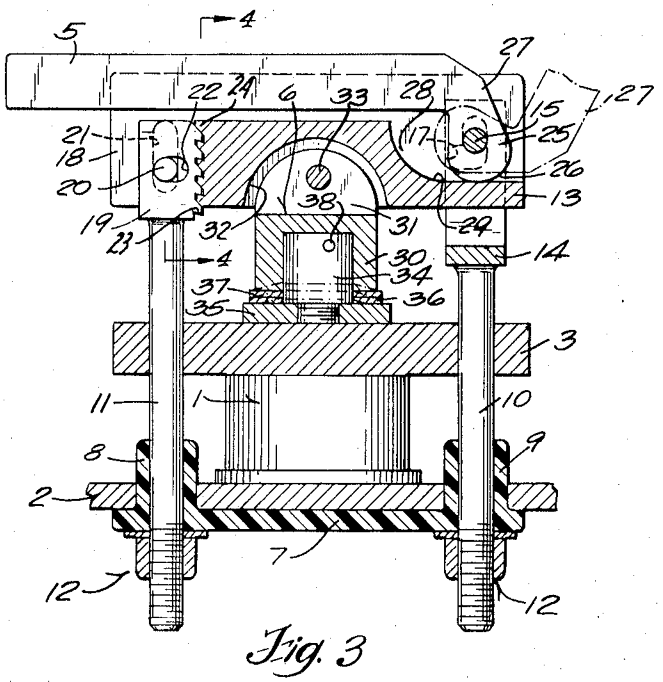
FIG. 3 is an enlarged, vertical section taken generally on line 3–3 of FIG. 2.
Figure 4:
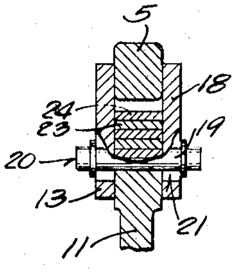
FIG. 4 is a fragmentary view taken generally on line 4–4 of FIG. 3.

Saddle member 13 is generally a platelike member having a slot 17 through which the pin 15 projects. The lower end of the slot 17 includes a lateral extension, as shown in FIGS. 1 and 3. This permits limited vertical and horizontal movement of the corresponding end of the saddle member 13 as well as pivotal movement about the pin 15.

The platelike saddle member 13 extends diametrically across the position of element 1 and terminates in a bifurcated end 18 telescoped over a correspondingly formed square head 19 of the opposite clamping bolt 11. A pin and ring retainer unit 20 extends through appropriate openings in the sidewalls of the bifurcated end 18 and the head 19 of bolt 11, to provide a releasable interconnection of the saddle member 13 to the head 19. The interconnection includes a vertical slot 21 in the opposite sidewalls of the bifurcated end and a horizontal slot 22 in the head 19 of the bolt 11, for purposes more fully developed hereinafter.

Additionally, the mating or opposed surfaces of the head 19 and base of the bifurcated end 18 of saddle member 13 are provided with mating serrated surfaces including opposed complementing locking teeth 23 on the head 19 and complementing locking teeth 24 on the saddle member 13. Generally, the locking teeth 23 and 24 are similarly formed as square nose or stubbed teeth. The locking teeth 23 have generally flat lower edge and a substantially inclined upper edge and the locking teeth 24 are oppositely formed with a flat upper edge and inclined lower edge. For example, in a practical construction, the lower surface of teeth 23 extended inwardly and upwardly at approximately fifteen degrees to the horizontal. The upper surface of the teeth 23 correspondingly increased at an angle of approximately forty-five degrees. Conversely, the locking teeth 24 on the base of the bifurcated end of the saddle member 13 had the lower surface extending inwardly and downwardly at approximately fifteen degrees to establish complementary surfaces. In the full line position shown, the teeth 23 and 24 are disposed in mating engagement to interlock and fix the left end of the saddle member 13 as shown in FIG. 3 to the upper end of the clamping bolt 11. As a result, a vertical movement of the saddle member at the corresponding end is restricted by the extension of the bolt 11 and the interconnecting pin which extends through the horizontally extending slot of the head 19 of the bolt 11. The serrated surface interconnection provides a releasable adjustable interconnection means for positioning the corresponding end of the saddle member 13 and therefore the spring loading means or unit 6 with respect to the element 1.

The opposite end of the saddle member 13 is interconnected by the pivot pin 15 to the upper end 14 of bolt 10. As previously noted, the interconnection includes the generally L-shaped slot 17 which permits restricted vertical and horizontal movement of the saddle member 13 on the pin 15.

The platelike saddle member 13 is provided with a recessed portion in the upper surface to accommodate a cam end 25 of the pivotally mounted lever 5. The cam end 25 is an integral disclike portion integrally formed with the straight line lever portion and including a cam surface including a relatively large radius locking portion 26 and an immediately adjacent smaller release portion 27. The cam end 25 is pivotally mounted within a cam recess 28 portion in the saddle member defining a mating cam surface 29 on which the cam surface 26 slides. In the full line position shown, the lever 5 is pivoted to dispose the main lever portion extending horizontally through the corresponding channel portion of the saddle member 13 and rotating of the relatively large radius locking portion 26 into engagement with the cam surface 29 formed in the saddle member 13. As a result, the saddle member 13 is moved downwardly within the fork 14, the pivot pin 15 passing through the upper end of the slot 17, in the full line position shown.

With the lever 5 rotated to the dotted line position, the relatively small release radius portion 27 is aligned with the cam surface 29 and the saddle member 13 may move upwardly as a result of the raising forces established by the spring loading unit 6 which is presently described. The saddle member 13 generally pivots upwardly with slight lateral movement to the right as viewed in FIG. 3, as a result of the double slot interconnection of the opposite end of the saddle member 13 to the head 19 of bolt 11. Thus, as the saddle member moves upwardly on the pin 15 the opposite end must move slightly inwardly with the pin 20 in the horizontal slot 22 and downwardly on the pin 20 as a result of the vertical slot 21 in order to maintain proper location of centers between the vertically movable slots 17 and the pin 20.

The spring loading unit 6 in the illustrated embodiment of the invention includes a pressure cup 30 having a tab 31 which projects upwardly into a semicircular recess 32 in the underside of the saddle member 13. A pin and retainer ring unit 33 extends through the member 13 and the tab 31 to pivotally interconnect the tab 31 and therefore the spring loading unit 6 to the saddle member 13.

The pressure cup 30 extends downwardly over a cylindrical guide member 34. A pressure plate 35 is secured to the lower end of the cylinder guide member 34 as by a threaded stud projecting downwardly from the guide member 34 and into a correspondingly threaded opening in the central portion of the pressure plate 35. The pressure plate 35 extends radially outwardly beneath the lowermost edge of the pressure cup 30. A pressure adjusting washer 36 rests on the upper surface of the pressure plate 35 properly locates a corresponding annular pressure spring 37 resting on the upper surface of the washer 36 in alignment with the lower edge of pressure cup 30. The pressure spring 37 is generally a Belleville type and in the unstressed condition has a generally cone shape with the central portion flexing upwardly adjacent the guide member. Downward movement of the pressure cup 30 forces the adjacent portion of the pressure spring 37 to move downwardly on the guide member 34 and creates a spring force acting between the edge of pressure cup 30 and the pressure plate 35. The pressure plate 35 bears directly upon the back or upper side of the cooling fin or plate 3, and thus transmits the spring forces to the stacked assembly comprising the cooling plates 2 and 3 and the intermediate or clamped solid-state element 1.

In the illustrated embodiment of the invention, the pressure cup 30 is guided on the guide member 34 by a guide pin 38 which projects laterally outwardly of the member 34 through a guide slot 39 in the sidewall of the pressure cup 30. The slot 39 is shown as an offset bayonet type slot such that the guide member remains interconnected to the pressure cup 30 if the element 1 is removed and the plate 3 is dropped downwardly thereby allowing the pressure plate 35 and attached cylinder guide member 34 to drop downwardly.

The operation of the illustrated embodiment of the invention may be fully summarized as follows. In the full line position shown in FIG. 3, the closing of the clamping lever 5 locates the locking portion 27 of cam end 25 with respect to cam surface 29 to establish a downward force on the corresponding end of the saddle member 13. This force is transmitted through the tab connection to the pressure cup 30 which moves downwardly compressing the spring 37 downwardly into the pressure plate 35. The latter engages the upper surface of the cooling plate 3 and exerts a downward force on the plate 3 and the aligned element 1 clamping the element 1 firmly between the cooling plate 2 and 3. The washer 36 is selected to adjust the spring pressure to maintain a desired pressure engagement between the surfaces of the element 1 and the respective plates 2 and 3. In this manner, the element 1 is maintained in excellent thermal conductivity with the plates 2 and 3 to produce the necessary thermal dispensation of the heat from the junction of element 1. Furthermore, the contact permits the elements 2 and 3 to form the electrical circuit connections for a diode or other similar solid-state element.

If, for any reason, it is necessary or desired to replace the element 1, the operator merely pivots the lever 5 in a clockwise direction as viewed in FIG. 3. In so doing, the relatively large clamping radius moves 26 along the corresponding surface of the cam surface 29 of the saddle member 13. The relative small release radius portion 27 moves into alignment with the vertical portion of the cam surface 29 and allows limited vertical movement of the saddle member 13 with respect to the cam end of the lever 5. This allows the disc spring 37 to force the pressure cup 30 upwardly and relieve the pressure on the saddle member 13 and the element 1.

The saddle member 13 can be repositioned laterally as a result of the lateral slots 22 in head 19 and the offset lower portion of slot 17 to release the locking teeth 23 and 24 to permit disassembly of the clamping assembly. As a result, the element 1 can be removed and replaced with a different member. Furthermore, the particular vertical alignment of the respective locking teeth 23 and 24 will vary the pivot point connection of the saddle member with respect to the tab connecting pin 33 and thereby, vary the movement with respect to the pressure plate 35 and element 1 and thereby provide a further adjustment of the clamping pressure applied to element 1.

The present invention thus provides a relatively simple and inexpensive construction for establishing a firm reliable releasable clamping of a disc type rectifier diode, controlled rectifier or the like to one or more heat sink surfaces with a controlled pressure engagement. The connection not only maintains the desired thermal connection between the element to be protected in the heat sink, but permits the element or the heat sink member to be employed as one of the terminal members to conduct current to and from the element.

I claim:

1. In combination, a solid-state element, a heat sink having a support surface upon which the solid-state element is held, a fixed support means including a pair of supports connected to the heat sink to the opposite sides of said support surface, a spring means overlying the support surface and the outer end of the solid-state element, and releasable lever means having a saddle member movably connected to the pair of supports and spanning said support surface with said spring means secured to the saddle member and an elongated lever pivotally mounted to the fixed support means with a pivot axis normal to the elongation of the lever, said lever being coupled to the saddle member in a first predetermined position holding the saddle member and spring means toward the solid-state element and into clamping engagement with the solid-state element against said support surface to support said element in fixed relation to said support surface and in a second position holding the saddle member and the spring means from said solid-state element and thereby directly permitting the removal and insertion of the solid-state element between the spring means and the heat sink.

2. The releasable clamp assembly of claim 1 wherein said support surface in planar and said solid-state element is a disclike element having a planar end resting upon the support surface of the heat sink and having an opposite parallel planar end, a second heat sink member resting on said opposite end between the element and the spring means.

3. The releasable clamp assembly of claim 1 wherein a metal plate defines said heat sink, said pair of supports including a pair of clamp rod means extending from said metal plate in laterally spaced relation to the support surface of the heat sink and having means electrically insulating the rod means from the plate, said saddle member being movably mounted on said rod means, said spring means having a mounting member coupled to the center of the saddle member and having a pressure plate aligned with said solid-state element and having a spring element defining said spring means, said spring element being disposed between the mounting member and the pressure plate, and said lever urging said mounting member toward said pressure plate to compress said spring element and establish clamping engagement of said pressure plate against said solid-state element.

4. The releasable clamp assembly of claim 1 wherein a metal plate defines said heat sink, said pair of supports including a pair of spaced clamp rod means extending from said metal plate on diametrically opposite sides of the support surface and having means to electrically insulate the rods from the metal plate, said saddle member being pivotally connected to the outer end of a first rod means and overlying said solid-state element with the opposite second end releasably connected to the outer end of the second rod means, said spring means having a mounting member coupled to the center of the saddle member and having a pressure plate aligned with said solid-state element and having a spring element disposed between the mounting member and the pressure plate, and said lever being pivotally mounted to the upper end of the first rod means and having a cam portion aligned with a cam portion of the saddle member for urging said saddle member toward said metal plate to establish clamping engagement of said pressure plate against said solid-state element.

5. The releasable clamp assembly of claim 4 wherein said clamp rod means includes rods extending through openings in said plate and having means to prevent the back ends of the rods from passing through the openings, and an insulator means encircling said rods at said openings to electrically insulate the rods from the plate.

6. The releasable clamp assembly of claim 4 wherein said saddle member is a platelike member spanning said rod means and having the second end of the rod means coupled to the corresponding rod means by complementing teeth and a pivot connection permitting relative lateral movement between the serrated teeth for adjusting the saddle member relative to solid-state element.

7. The releasable clamp assembly of claim 4 wherein said mounting member of said spring means is pivotally connected to said saddle member and includes an outwardly opening pressure cup, said pressure plate including a guide member projecting into said pressure cup, and said spring element including a spring washer disposed between the edge of the pressure cup and the pressure plate.

8. The releasable clamp assembly of claim 1 wherein a metal plate defines said support surface, said pair of supports including a pair of clamp rods extending through openings in said plate and diametrically spaced to the opposite sides of the support surface, means to prevent the back ends of the rods from passing through the openings, an insulator means electrically insulating the rods from the plate, said saddle member being connected to the outer ends of the rods and overlying said solid-state element, said spring means having a mounting member coupled to the center of the saddle member and having a pressure plate aligned with said solid-state element and having a spring means disposed between the mounting member and the pressure plate, and said lever urging said saddle member toward said metal plate to establish said clamping engagement of said pressure plate against said solid-state element.

9. The releasable clamp assembly of claim 1 wherein a metal plate defines said heat sink, said pair of supports including a pair of clamp rods extending through openings in said metal plate and diametrically spaced to the opposite sides of the support surface of the metal plate to prevent the back ends of the rods from passing through the openings, and having means electrically insulating the rods from the metal plate, said saddle member having one end connected by a slot to a pin on the outer end of the first rod and overlying said solid-state element, the opposite end of said saddle member being releasably coupled to the outer end of the second rod by complementing teeth and by a pin passing through a pair of perpendicular slots in the saddle member and the rod, and spring means having a cup-shaped mounting member pivotally attached to the center of the saddle member and having a pressure plate aligned with said support surface and the solid-state element, said pressure plate having a cylindrical guide projecting upwardly into the mounting member and having a spring washer disposed over the guide between the outer edge of the mounting member and the pressure plate, and said lever pivotally mounted with the saddle member to the first rod and having a cam portion engaging a cam portion on the saddle member for selectively urging said saddle member toward said metal plate to establish said clamping engagement of said pressure plate against said solid-state element.

10. The releasable clamp of claim 9 wherein said cup-shaped mounting member includes a locking slot in the sidewall and the guide having a pin projecting outwardly through said locking slot.